United States Patent [19]
Dai et al.

[11] Patent Number: 5,790,000
[45] Date of Patent: Aug. 4, 1998

[54] CASCADED SURFACE WAVE DEVICE FILTERS PROVIDING BALANCED AND UNBALANCED SIGNAL CONNECTIONS

[75] Inventors: Ji-Dong Dai, Kanata; Yufeng Xu, Nepean; John Choo Beng Saw; Zhuo-Hui Chen, both of Kanata, all of Canada

[73] Assignee: Northern Telecom Limited, Montreal, Canada

[21] Appl. No.: 659,396

[22] Filed: Jun. 6, 1996

Related U.S. Application Data

[60] Provisional application No. 60/000,283 Jun. 16, 1995.
[51] Int. Cl.⁶ .................................................. H03H 9/64
[52] U.S. Cl. .................... 333/193; 333/194; 310/313 D; 310/313 B
[58] Field of Search ........................... 333/193–196; 310/313 R, 313 B, 313 C, 313 D

[56] References Cited

U.S. PATENT DOCUMENTS

| | | | |
|---|---|---|---|
| 4,539,502 | 9/1985 | Este et al. | 310/313 B |
| 5,223,762 | 6/1993 | Masaie et al. | 310/313 D |
| 5,365,138 | 11/1994 | Saw et al. | 310/313 D |
| 5,475,348 | 12/1995 | Hode et al. | 333/195 |
| 5,568,002 | 10/1996 | Kawakatsu et al. | 310/313 B |

FOREIGN PATENT DOCUMENTS

| | | | |
|---|---|---|---|
| 0605884 | 7/1994 | European Pat. Off. | |
| 405136651A | 6/1993 | Japan | 333/193 |
| 405335881A | 12/1993 | Japan | 333/193 |

OTHER PUBLICATIONS

"Wideband Low Loss Double Mode SAW Filters", T. Morita et al, Proceedings of the IEEE Ultrasonics Symposium, 1992, pp. 95–104.

"High Performance SAW Filters With Several New Technologies for Cellular Radio", M. Hikita et al, IEEE Ultrasonics Symposium, 1984, Proceedings, pp. 82–92.

"Narrow Bandpass Filter Using Double–Mode SAW Resonators on Quartz", M. Tanaka et al, IEEE 38th Annual Frequency Control Symposium, 1984, Proceedings, pp. 286–293.

Primary Examiner—Robert J. Pascal
Assistant Examiner—Barbara Summons
Attorney, Agent, or Firm—R. John Haley

[57] ABSTRACT

A cascaded surface wave device filter comprises two 2-pole surface wave device filters connected in cascade. The 2-pole filters each provide a balun function between balanced and unbalanced signal connections, and have either their unbalanced or their balanced signal connections interconnected in the cascade to reduce electromagnetic feedthrough and improve spurious mode suppression. The 2-pole filters are conveniently longitudinally coupled double mode surface wave resonators which are described, or transversely coupled double mode surface wave resonators. Higher order filters can be provided by connecting further 2-pole filters in the cascade. The cascaded filter is particularly useful for filtering at radio and intermediate frequencies in cellular radio equipment.

17 Claims, 5 Drawing Sheets

CASCADED SURFACE WAVE DEVICE FILTERS PROVIDING BALANCED AND UNBALANCED SIGNAL CONNECTIONS

This application claims the benefit of United States Provisional Application No. 60/000,283 filed Jun. 16, 1995 and entitled "Longitudinally Coupled Double Mode Surface Wave Resonators", the entire disclosure of which is hereby incorporated herein by reference.

CROSS REFERENCE TO RELATED APPLICATION

Reference is directed to Saw et al. United States application Ser. No. 08/659,455 filed simultaneously herewith and entitled "Longitudinally Coupled Double Mode Surface Wave Resonators".

BACKGROUND OF THE INVENTION

This invention relates to cascaded surface wave device filters. The term "surface wave" is used herein to embrace surface acoustic waves (SAWs), including leaky SAWs, and surface skimming bulk waves.

Saw et al. U.S. Pat. No. 5,365,138 issued Nov. 15, 1994 and entitled "Double Mode Surface Wave Resonators" describes a transversely coupled double mode surface wave resonator comprising two IDTs (inter-digital transducers), arranged side by side between reflection gratings, on a surface of a piezoelectric substrate to provide for coupling of surface waves therebetween, each IDT having interleaved electrodes extending from a common rail between the two IDTs and from a respective outer rail of the IDT. In the arrangements of FIGS. 8, 9, 10, and 11 of that patent, one of the IDTs and its outer rail is divided into two halves for providing a balanced or differential signal connection to the resonator, and the other IDT provides an unbalanced or single-ended connection, whereby the resonator operates not only as a filter but also as a balun (balanced-to-unbalanced signal transformer). As explained in that patent, such a resonator is particularly useful for filtering at an IF (intermediate frequency) in cellular radio (including personal communications systems, or PCS) equipment, with a differential or balanced signal which is preferred at the IF for linearity and bandwidth. A transversely coupled double mode surface wave resonator is also referred to as a waveguide coupled resonator or WCR, this abbreviation being used below.

A paper by T. Morita et al. entitled "Wideband Low Loss Double Mode SAW Filters", Proceedings of the IEEE Ultrasonics Symposium, 1992, pages 95 to 104, discusses the use of longitudinally coupled double mode surface wave resonators (LCRs) for RF (radio frequency) filtering in cellular radio equipment. An LCR described in the paper comprises a symmetrical arrangement of a centre IDT between two lateral IDTs and two reflection gratings, with a first unbalanced connection to the centre IDT and a second unbalanced connection to the two lateral IDTs which are connected in parallel with one another.

As described below and in the cross-referenced application, an LCR can also be arranged to provide a balun function between a differential or balanced port (input or output) and a single-ended or unbalanced port (output or input, respectively). The same principles can also be applied to filters using other types of surface wave devices, for example bidirectional transversal filters and SPUDT (single-phased uni-directional transducer) filters.

The resonators and other filters discussed above each provide a 2-pole filter, which is generally not sufficient to meet the stringent requirements of RF and IF filters in cellular radio equipment. Accordingly, it is known to provide a filter having 4, 6, or more poles by providing 2, 3, or more 2-pole surface wave device filters on the same die or substrate, or in the same package, and connecting them in cascade.

An object of this invention is to provide an improved filter comprising cascaded surface wave devices.

SUMMARY OF THE INVENTION

According to one aspect of this invention there is provided a cascaded surface wave device filter comprising: a first 2-pole surface wave device filter, the first filter having an input port and an output port, one of the ports providing an unbalanced signal connection and the other of the ports providing a balanced signal connection to the first filter; a second 2-pole surface wave device filter, the second filter having an input port and an output port, one of the ports providing an unbalanced signal connection and the other of the ports providing a balanced signal connection to the second filter; and a cascade connection of the first filter with the second filter, the cascade connection connecting together either the unbalanced signal connections or the balanced signal connections of the first and second filters.

Thus the invention provides two 2-pole surface wave device filters in cascade, each filter having a balun function, to provide a 4-pole cascaded filter having either unbalanced or balanced input and output ports. The cascaded filter has substantially reduced electromagnetic feedthrough and improved spurious mode suppression. The two 2-pole filters can be arranged side by side on the same substrate, or can be on separate substrates in the same package, or can be in separate packages.

Each of the first and second filters preferably comprises either a longitudinally coupled double mode surface wave resonator or a transversely coupled double mode surface wave resonator.

A higher order filter can be provided by including at least one further 2-pole surface wave device filter connected in cascade with the first and second filters.

According to another aspect this invention provides a cascaded surface wave device filter comprising a plurality of 2-pole surface wave device filters connected in cascade, wherein two of the 2-pole filters each have one unbalanced signal connection and one balanced signal connection, and said two of the 2-pole filters have either their unbalanced signal connections or their balanced signal connections interconnected in the cascade.

BRIEF DESCRIPTION OF THE DRAWINGS

The invention will be further understood from the following description with reference to the accompanying drawings, in which:

FIG. 1 illustrates.

FIG. 3 illustrates.

FIG. 5 illustrates.

FIG. 7 illustrates.

DETAILED DESCRIPTION

As stated above, waveguide or transversely coupled double mode surface wave resonators (WCRs) providing a balun function, i.e. having a differential or balanced port (input or output) and a single-ended or unbalanced port (output or input, respectively), are fully described with reference to and illustrated in FIGS. 8 to 11 of Saw et al. U.S. Pat. No. 5,365,138. Each of these WCRs constitutes a 2-pole filter.

Longitudinally coupled double mode surface wave resonators (LCRs) providing a balun function are described below with reference to FIGS. 1 to 8. The odd-numbered figures each illustrate an LCR and its connections, and the following even-numbered figures each illustrate boundary regions between centre and lateral IDTs of the respective LCR.

Figure 1:
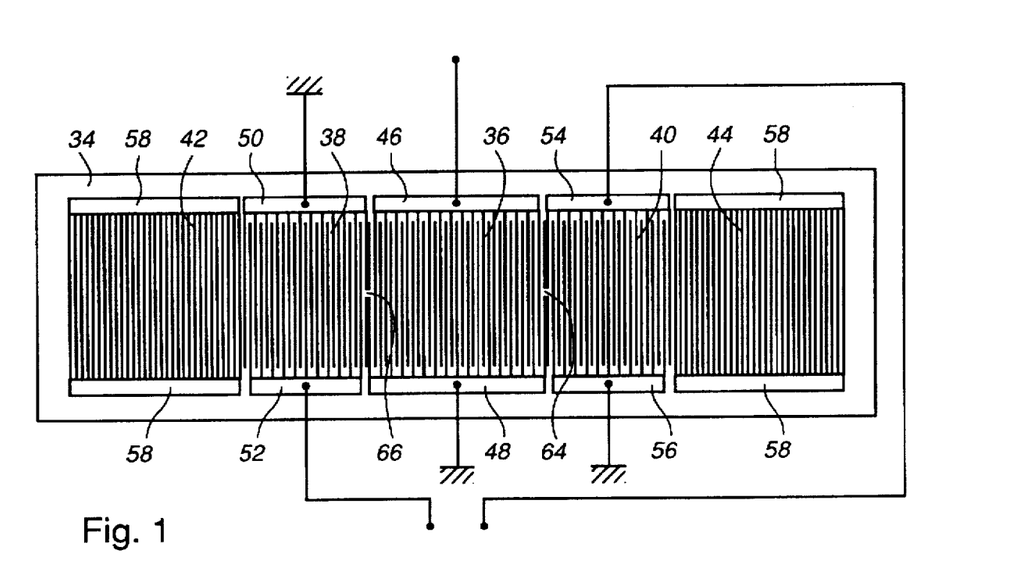

Referring to FIG. 1, the LCR comprises a substrate 34 of piezoelectric material on which a centre IDT 36 and two lateral IDTs 38 and 40 are arranged symmetrically and positioned longitudinally between two reflection gratings 42 and 44.

The centre IDT 36 comprises inter-digital electrodes or fingers which have a width of $\lambda/4$ and a pitch of $\lambda/2$, where $\lambda$ is the wavelength of a SAW to be propagated, with electrodes or fingers extending from opposite rails 46 and 48 of the IDT overlapping one another over most of their length, referred to as the acoustic aperture of the IDT. Similarly, each of the lateral IDTs 38 and 40 comprises inter-digital fingers, with the same width of $\lambda/4$, pitch of $\lambda/2$, and overlapping length as the fingers of the centre IDT 36, extending from opposite rails 50,52 of the IDT 38 and 54, 56 of the IDT 40.

The reflection gratings 42 and 44 also comprise fingers with the same width $\lambda/4$ and pitch $\lambda/2$; this pitch can be increased or decreased to reduce the level of spurious modes in the resonator. As shown in FIG. 1, the fingers of the reflection gratings 42 and 44 extend between and are inter-connected by outer rails 58 which are electrically floating. Alternatively, these rails can be grounded, or these rails can be omitted, the fingers of the reflection gratings then all individually being electrically floating. Furthermore, the reflection gratings 42 and 44 can be constituted by reflector grooves in the substrate 34, as is known in the art. Similar comments apply to the other arrangements described below.

By way of example, the substrate 34 can comprise 64° Y-X lithium niobate, with $\lambda$ corresponding to a centre frequency of 836.5 MHz. The conductive electrodes and fingers can be of aluminium having a thickness of 2000 Å, with an acoustic aperture of 40 $\lambda$. The centre IDT 36 can have about 31 electrodes, each of the lateral IDTs 38 and 40 can have about 19 electrodes, and each of the reflection gratings 42 and 44 can have about 250 fingers. These parameters are given purely by way of example, and these or different parameters also apply to the other LCR arrangements described below. With such numbers of electrodes and fingers, it should be appreciated that the illustrations of the electrodes and fingers in the drawings are purely diagrammatic to facilitate a full description of the various arrangements.

The pitch of $\lambda/2$ is maintained as a finger-to-finger distance or separation of the lateral IDT 38 from the reflection grating 42, and of the lateral IDT 40 from the reflection grating 44. As is described in the paper by Morita et al., with the LCR arranged and connected in this manner the second longitudinal mode is not excited, and the resonator or filter is configured using only the first and third longitudinal modes. The resonance frequencies of the first and third longitudinal modes, which determine the bandwidth of the filter, have the greatest difference, and hence produce the greatest bandwidth for the filter, when the separation L, between the adjacent grounded fingers of the centre IDT 36 and each of the lateral IDTs 38 and 40, is equal to $\lambda/4$. More generally, the bandwidth is greatest when $L=\lambda/4+n\lambda/2$, where n is zero or a positive integer, but the acoustic coupling between the IDTs is reduced when n is greater than zero.

Figure 2:
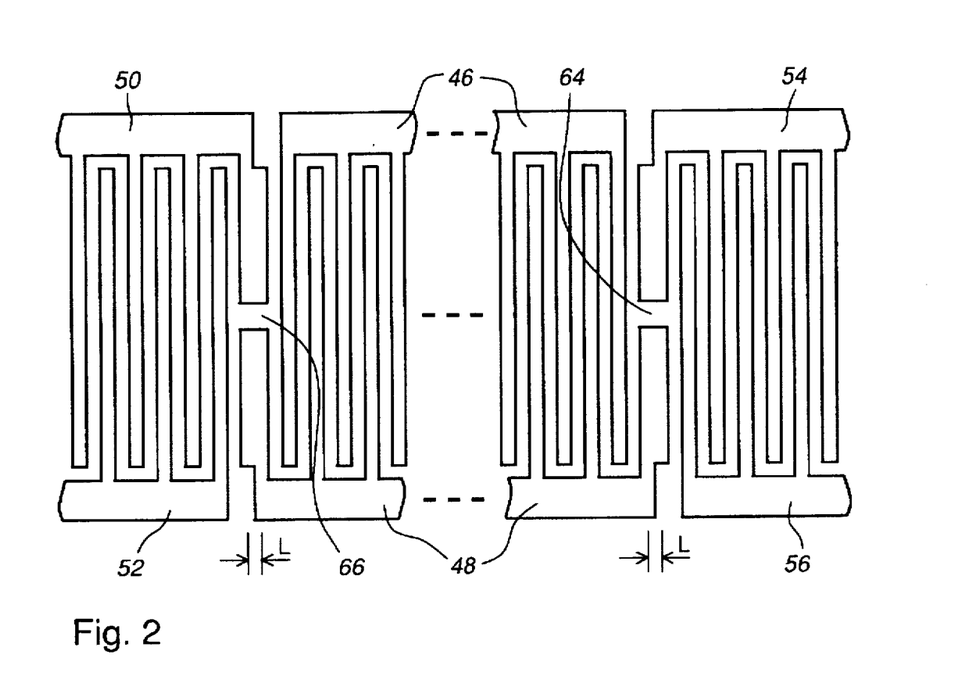
FIG. 2 illustrates in greater detail features of, a longitudinally coupled double mode SAW resonator (LCR) providing a balun function.

Thus in order to achieve a maximum bandwidth and optimum coupling, the finger-to-finger distance or separation of the centre IDT 36 from each of the lateral IDTs 38 and 40 in the LCR of FIG. 1 is reduced to $\lambda/4$. As the width of each finger is also $\lambda/4$, this results in the adjacent fingers of the centre IDT 36 and the lateral IDTs 38 and 40 touching, as is shown in FIG. 1. FIG. 2 illustrates in greater detail the regions at the boundaries between the centre IDT 36 and the lateral IDTs 38 and 40, showing the touching fingers with the separation of the IDTs denoted by L.

In the LCR of FIG. 1, the centre IDT 36 provides a single ended or unbalanced connection with the rail 46 connected to a signal terminal (e.g. an input terminal) and the rail 48 grounded. Connections to the two lateral IDTs 38 and 40 are arranged to provide a differential or balanced connection. As shown in FIG. 1, the rail 50 of the lateral IDT 38 and the rail 56 of the lateral IDT 40, on opposite sides of the LCR, are grounded, and the other rails 52 of the lateral IDT 38 and 54 of the lateral IDT 40, also on opposite sides of the LCR, are connected to respective differential signal terminals (e.g. output terminals).

In view of the adjacent touching fingers of the centre and lateral IDTs, to avoid a short circuit of the rail 54 to ground via the rail 48 these touching fingers are interrupted at a point along their length by a gap 64. This gap 64 is shown in the drawings as being mid-way along the lengths of the touching fingers at the boundary between the IDTs 36 and 40, but it can instead be anywhere along the length or at either end of the touching fingers. A similar interruption or gap 66 is provided at a point mid-way along the lengths of the touching fingers at the boundary between the IDTs 36 and 38. Although this gap 66 is not required to avoid a short circuit with the connections shown in FIG. 1, because both of the rails 48 and 50 to which the touching fingers at this boundary are connected are grounded, it is desirable to maintain symmetry of the LCR. In addition, it provides the important advantage that other connections to the LCR are possible without risk of a short circuit. For example, the connections to the rails 46 and 48 of the centre IDT 36 can be reversed. In this respect it should be appreciated that the particular connections shown are given by way of example, and that input and output connections, and connections to the centre IDT 36 and to the lateral IDTs 38 and 40, can be interchanged.

It can be appreciated that a similar arrangement can be provided, without the adjacent fingers of the centre and lateral IDTs touching and hence without any gaps 64 and 66, with an increase of the spacing L between the centre IDT 36 and each of the lateral IDTs 38 and 40 to $3\lambda/4$. Although the increase in the spacing L by $\lambda/2$ changes the signal phase for each lateral IDT by 180°, this applies to both of the lateral IDTs 38 and 40 so that their relative phase is unchanged and they still provide a differential or balanced output with the connections shown.

In the above arrangements the differential or balanced connections to the lateral IDTs 38 and 40 are taken from opposite sides of the LCR. This may result in a relatively long connection path which may be undesirable. This is avoided in the LCR arrangements described below. Again in these arrangements the spacing L between the centre IDT 36 and each of the lateral IDTs 38 and 40 is equal to $\lambda/4+n\lambda/2$ to achieve the greatest bandwidth.

Figure 3:
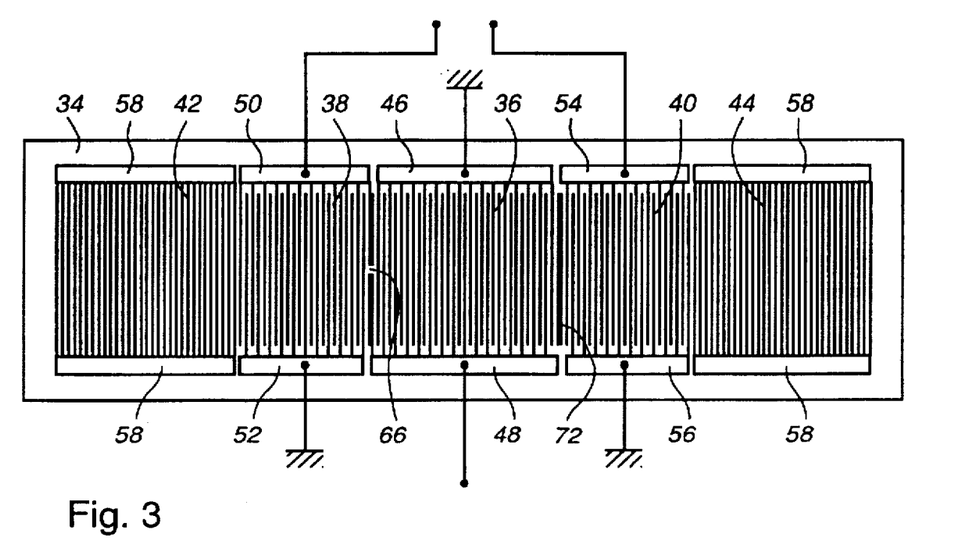
Figure 4:
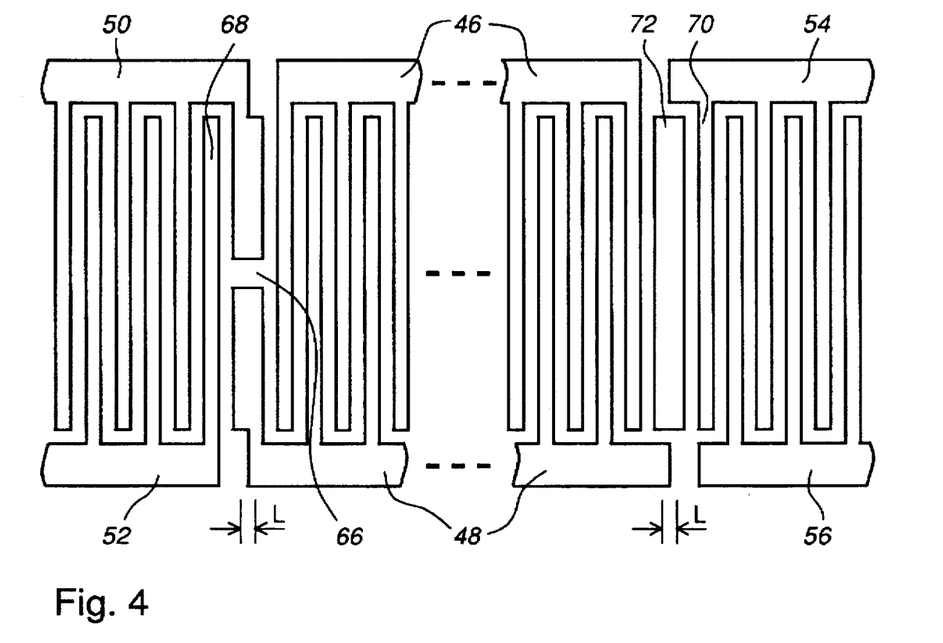
FIG. 4 illustrates in greater detail features of, another LCR providing a balun function.

In the LCR of FIGS. 3 and 4 the polarity of the lateral IDT 40 is reversed, i.e. the phase of this IDT is changed by 180°, relative to the lateral IDT 38. This is shown best in FIG. 4, in which it can be seen for example that whereas for the lateral IDT 38 the second finger 68 from the centre IDT 36 extends upwardly (as shown) from the rail 52, for the lateral IDT 40 the second finger 70 from the centre IDT 36 extends downwardly (as shown) from the rail 54 on the opposite side of the LCR. FIG. 3 illustrates connections to the LCR, the rails 52 and 56 of the lateral IDTs 38 and 40 on the same side of the LCR being grounded, the rails 50 and 54 of the lateral IDTs providing a differential or balanced (e.g. input) signal connection, the rail 46 of the centre IDT 36 being grounded, and the rail 48 of the centre IDT 36 providing a single ended or unbalanced (e.g. output) signal connection.

In this case with the spacing $L=\lambda/4$ (n is zero) and the rails 48 and 50 carrying different signals, the gap 66 is required in the adjacent, touching fingers at the boundary between the IDTs 36 and 38, as already explained above with reference to FIGS. 5 and 6. At the boundary between the IDTs 36 and 40, a short circuit via the adjacent, touching fingers between the rails 48 and 56 must also be avoided. As illustrated in FIGS. 3 and 4, a short circuit is conveniently avoided by providing the adjacent, touching fingers as a floating finger 72, having a width of $\lambda/2$, which is not connected to either of the rails 48 and 56. In other words, in this case a gap is provided at both ends of the adjacent, touching fingers constituted by the double-width finger 72.

The slight degree of asymmetry which the above arrangement produces is not significant. Even this can be reduced or avoided by connecting the lower (as shown) end of the finger 72 to the rail 48, and optionally either providing a gap in the finger 72 mid-way along its length so that only the upper (as shown) part of this finger is electrically floating, or providing no gap in the finger 72 and instead moving the gap 66 to be adjacent to the rail 50 so that the arrangement is symmetrical. The floating finger 72 can also be omitted entirely, but this is less desirable.

Again in this case a similar arrangement can be provided, without the adjacent fingers of the centre and lateral IDTs touching and hence without any gap 66 or floating finger 72, with an increase of the spacing L between the centre IDT 36 and each of the lateral IDTs 38 and 40 to $3\lambda/4$.

Figure 5:
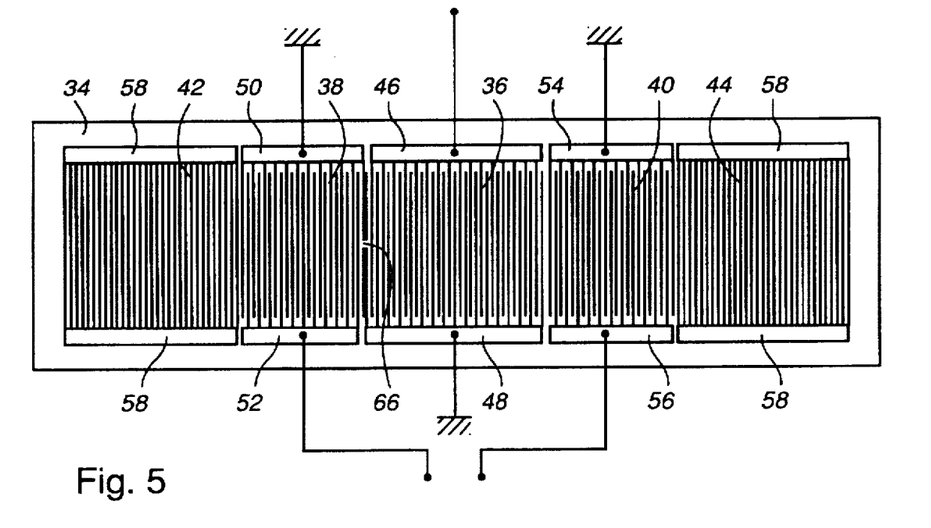
Figure 6:
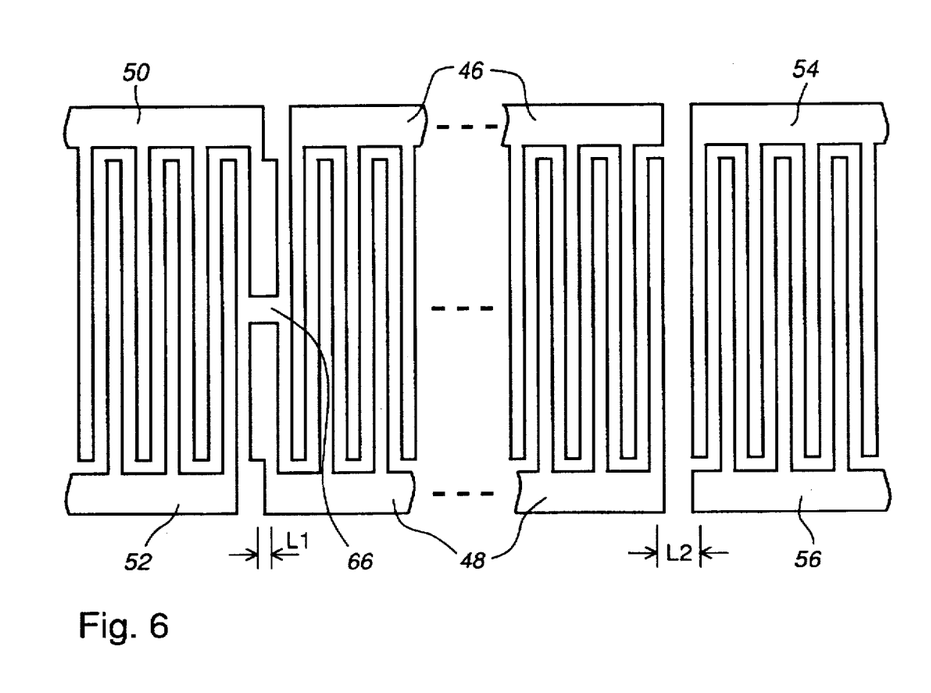
FIG. 6 illustrates in greater detail features of, a further LCR providing a balun function.

In the LCR of FIGS. 5 and 6, one of the lateral IDTs is displaced by $\lambda/2$ (more generally, by $\lambda/2+m\lambda$, where m is zero or a positive integer) to provide a change of phase between the two lateral IDTs. Thus in this LCR arrangement the spacings of the lateral IDTs 38 and 40 from the centre IDT 36 are different; these spacings are referred to as L1 and L2 respectively, and FIGS. 5 and 6 illustrate the case in which $L1=\lambda/4$ (i.e. n=0) and $L2=3\lambda/4$ (i.e. n=1, m=0).

Referring to FIGS. 5 and 6, the centre IDT 36 has a single ended or unbalanced (e.g. input) connection to its rail 46 with its rail 48 grounded, and the lateral IDTs 38 and 40 have their rails 50 and 54 grounded and provide a differential or balanced (e.g. output) connection via their rails 52 and 56 on the same side of the LCR. A short circuit between the rails 48 and 50 due to the spacing L1 of the IDTs 36 and 38 is avoided in the same manner as described above by providing the gap 66 mid-way along the lengths of the adjacent, touching fingers. This gap is not essential with the connections as shown in FIG. 5, because the rails 48 and 50 are both grounded, but it can be essential with other possible connection arrangements, for example with a reversal of all of the signal and ground connections in FIG. 5. The greater spacing L2 of the IDTs 36 and 40 avoids a risk of any short circuit, and provides a phase difference of 180° between the two lateral IDTs 38 and 40 to provide the desired differential signal.

From the above description, it should be appreciated that a differential connection to the lateral IDTs 38 and 40 can be provided by oppositely phased connections to these IDTs as in FIGS. 1 and 2, or by opposite polarities of (i.e. 180° phase difference between) these IDTs as in FIGS. 3 and 4, or by spacings of these IDTs from the centre IDT which differ from one another with a 180° phase difference as in FIGS. 5 and 6.

Figure 7:
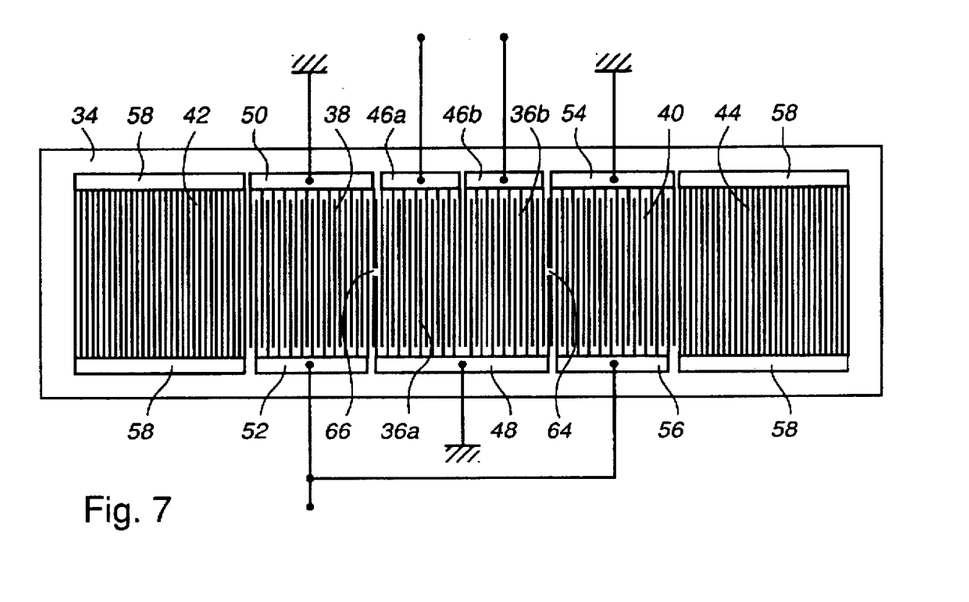
Figure 8:
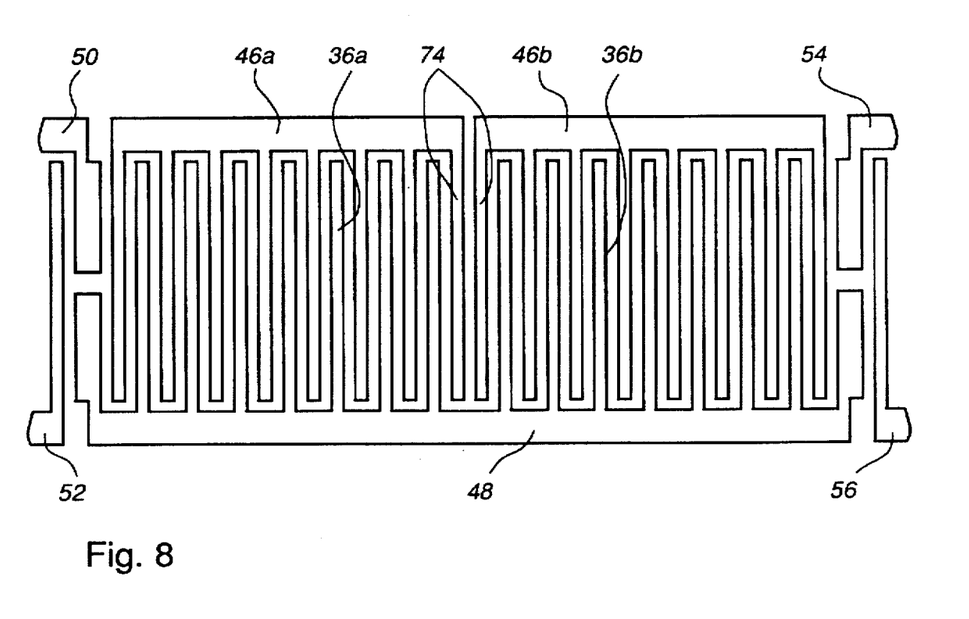
FIG. 8 illustrates in greater detail features of, yet another LCR providing a balun function.

Alternatively, a differential or balanced connection can be provided to the centre IDT 36, as shown in FIGS. 7 and 8. FIG. 7 illustrates an LCR in which the lateral IDTs 38 and 40 provide a single ended or unbalanced connection, and the centre IDT 36 provides a differential or balanced connection. FIG. 8 illustrates the centre IDT of this LCR in greater detail. Except for the centre IDT and the connections to the IDTs, the LCR of FIGS. 7 and 8 is the same as the LCR described above with reference to FIGS. 1 and 2. Accordingly, only the differences are described here.

Referring to FIGS. 7 and 8, the rail 48 of the centre IDT is grounded, the rails 50 and 54 of the lateral IDTs 38 and 40 are grounded, and a single ended or unbalanced connection is made in parallel to the rails 52 and 56 of the lateral IDTs 38 and 40. The signal (ungrounded) rail of the centre IDT is divided into two halves 46a and 46b which provide a balanced or differential connection to the centre IDT. The centre IDT correspondingly has two halves 36a and 36b, with signal fingers in the half 36a being connected to the rail half 46a and signal fingers in the half 36b being connected to the rail half 46b. Furthermore, there is a phase difference of 180=20 between the two halves 36a and 36b of the centre IDT. This is best illustrated in FIG. 8, in which it can be seen that two adjacent fingers 74 at the middle of the centre IDT are both signal fingers, one extending from the rail half 46a and the other extending from the rail half 46b. The finger pitch of $\lambda/2$ is maintained throughout the centre IDT halves 36a and 36b.

Thus, in the LCR arrangement of FIGS. 7 and 8, the centre IDT halves 36a and 36b provide a differential or balanced connection, with a phase difference of 180° between the two halves and hence between the rail halves 46a and 46b, instead of the lateral IDTs 38 and 40 as in the previously described LCR arrangements. As illustrated, the gaps 64 and 66 are provided in the adjacent, touching fingers, although they need not be present with the particular connections illustrated because the rails 48, 50, and 54 are all grounded.

The WCRs described in Saw et al. U.S. Pat. No. 5,365,138 referred to above and the LCRs described above each constitute a 2-pole filter with a balun function. Other 2-pole filters with a balun function can conceivably be provided using other types of surface wave devices, for example ladder structure, bidirectional transversal, and SPUDT filters. In order to provide particular filter characteristics, especially for image reject filters in transmitter and receiver circuits for cellular radio equipment, higher orders of filter, for example a 4-pole or 6-pole filter, may be needed. Two or more 2-pole surface wave device filters of a similar type can be provided and connected in cascade to constitute a 4-pole, 6-pole, etc. filter. As the particular form that each 2-pole surface wave device filter takes can vary, in the following description the different 2-pole filters are simply referred to as filter 1, filter 2, etc.

There are numerous combinations of ways in which two or more 2-pole filters can be cascaded to form a higher-order filter. In accordance with this invention, the forms of the 2-pole filters and their connections in cascade are selected in a manner which reduces electro-magnetic feed-through (EMFT) of the filter and also enhances spurious mode suppression. As these are major factors relating to filter performance, the nature of the cascading of the 2-pole filters plays an important role in determining the out-of-band rejection of the higher-order filter.

More particularly, in accordance with this invention a 4-pole filter is formed by a cascaded connection of two 2-pole surface wave device filters, each 2-pole filter being selected to have a balun function, i.e. to have one single-ended or unbalanced port and one differential or balanced port, as described above. Either the balanced ports of the two 2-pole filters are interconnected to form the cascade, so that the 4-pole filter has unbalanced or single-ended input and output ports, or the unbalanced ports of the two 2-pole filters are interconnected to form the cascade, so that the 4-pole filter has balanced or differential input and output ports. Higher order filters are constituted by cascading three or more 2-pole filters, with at least two of the 2-pole filters cascaded in the same manner as for the 4-pole filter. In this case the higher-order filter can have two single-ended ports or two differential ports, or it can provide a balun function with one single-ended port and one differential port. In each case the 2-pole filters can be provided on the same substrate, or on different substrates in the same package, or in different packages.

Figure 9:
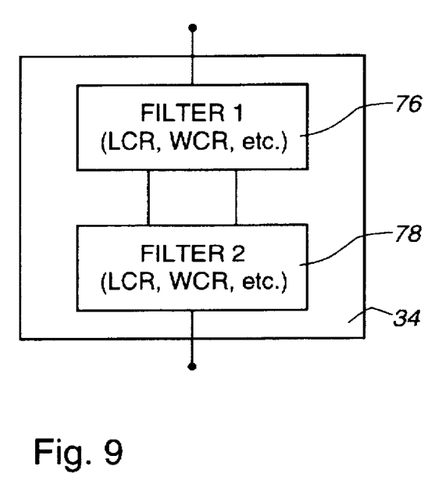
FIGS. 9 and 10 schematically illustrate alternative forms of 4-pole filter each comprising two cascaded surface wave devices, each device providing a balun function, in accordance with embodiments of this invention.

Referring to FIG. 9, a 4-pole filter is constituted by two 2-pole filters 76 and 78 provided in this case side by side on the same substrate 34. The 2-pole filters 76 and 78, labelled filter 1 and filter 2, each provide a balun function between a single-ended or unbalanced port and a differential or balanced port, and the two 2-pole filters are connected in cascade by having their balanced ports interconnected, so that the 4-pole filter cascade has a single-ended or unbalanced input and output. The 2-pole filters 76 and 78 can comprise LCRs in any of the forms described above, or WCRs as described with reference to any of FIGS. 8 to 11 of Saw et al. U.S. Pat. No. 5,365,138, or other 2-pole surface wave device filters providing a balun function. The 2-pole filters 76 and 78 can be arranged as a mirror image of one another, i.e. symmetrically about a line mid-way between the 2-pole filters, or they can be arranged so that one is a rotation of the other through an angle of 180° about a central point mid-way between the two 2-pole filters. The latter may be preferred for spurious mode suppression. The two 2-pole filters 76 and 78 are of the same type, e.g., both LCRs or both WCRs, but need not be identical to one another, and differences between the two 2-pole filters can enhance spurious mode suppression of the 4-pole filter cascade.

The cascaded filter arrangement of FIG. 9 provides enhanced EMFT suppression in that, although acoustic induced signals of the 2-pole filters add, the direct EMFT components of the 2-pole balun filters cancel one another because they are out of phase. The resulting EMFT suppression is improved by 10 to 20 dB in comparison to a conventional cascade of two single-ended input and single-ended output 2-pole filters. Spurious mode suppression, in the case of the 2-pole filters 76 and 78 being WCRs, arises because the balun filter arrangement of FIG. 9 does not support the anti-symmetric longitudinal surface wave mode, which is a major spurious mode for WCRs.

Figure 10:
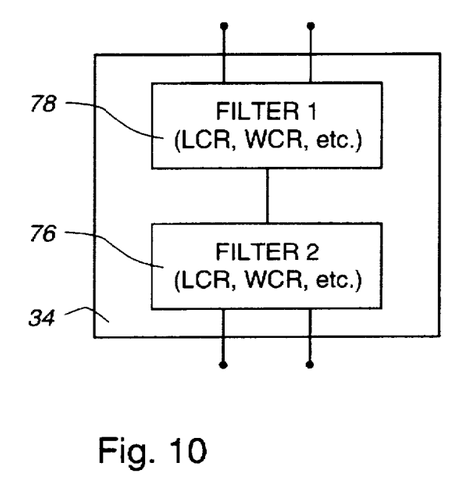

FIG. 10 illustrates an alternative arrangement of two 2-pole balun filters which provides similar advantages in a 4-pole filter having differential or balanced input and output ports. The arrangement of FIG. 10 also uses two 2-pole balun filters 78 and 76, of any of the types discussed above, in this case on the same substrate 34, the 2-pole filters being labelled filter 1 and filter 2 respectively. In this arrangement the two 2-pole filters are connected in cascade by having their unbalanced ports interconnected (for simplicity, ground connections are not shown in FIGS. 9 to 12), so that the 4-pole filter cascade has a differential or balanced input and output. Similar comments to those above for FIG. 9 also apply to the arrangement of FIG. 10.

Figure 11:
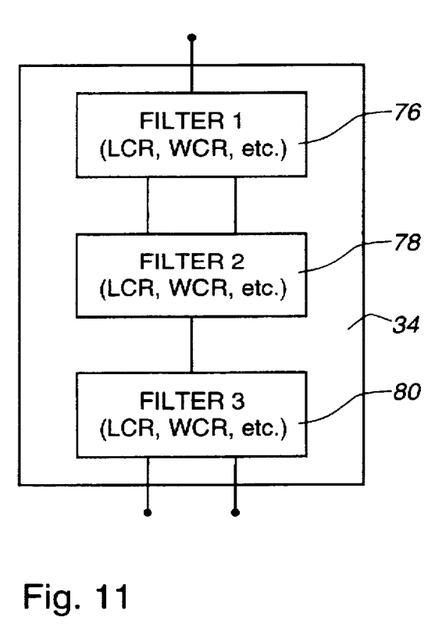
FIGS. 11 and 12 schematically illustrate alternative forms of 6-pole filter each comprising three cascaded surface wave devices, at least two of the devices each providing a balun function, in accordance with embodiments of this invention.
Figure 12:
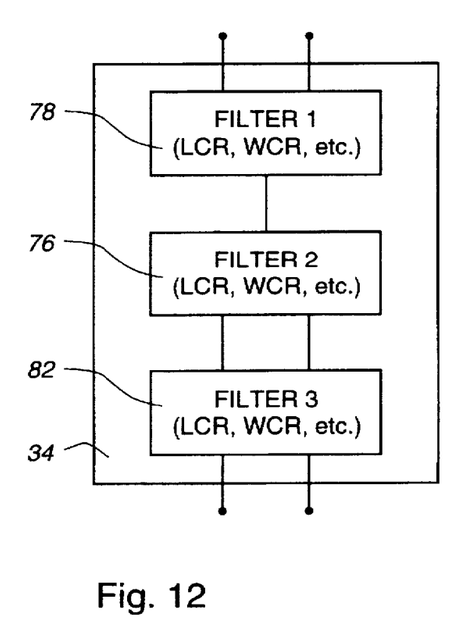

To provide a higher-order filter, a 4-pole filter cascade as described above with reference to FIG. 9 or 10 is cascaded with one or more further 2-pole filters. FIGS. 11 and 12 illustrate two alternative cascades each having one further 2-pole filter providing a 6-pole filter cascade.

Referring to FIG. 11, a 4-pole filter cascade, comprising the 2-pole balun filters 76 and 78 arranged as described above with reference to FIG. 9, is supplemented by a further 2-pole filter 80, labelled filter 3. As shown in FIG. 11, the 2-pole filter 80 has a single-ended port via which it is connected in the cascade to the single-ended port of the 2-pole filter 78, and has a differential or balanced port which thus constitutes a port of the 6-pole filter, which thereby also provides a balun function. In this case the 2-pole filter 80 can be similar or identical to the 2-pole filter 76. Alternatively, but not shown, the 2-pole filter 80 can have a single-ended or unbalanced port providing a second single-ended or unbalanced port of the 6-pole filter cascade.

Referring to FIG. 12, a 4-pole filter cascade, comprising the 2-pole balun filters 78 and 76 arranged as described above with reference to FIG. 10, is supplemented by a further 2-pole filter 82, labelled filter 3. As shown in FIG. 12, the filter 82 has a differential or balanced port via which it is connected in the cascade to the differential port of the filter 76, and also has a differential or balanced port which constitutes a port of the 6-pole filter, which thereby has balanced input and output ports. The 2-pole filter 82 can be as described with reference to any of FIGS. 2, 6, and 7 of Saw et al. U.S. Pat. No. 5,365,138 if it is a WCR, or can comprise both differential lateral IDTs as described above with reference to FIGS. 1 to 6 and a differential centre IDT as described above with reference to FIGS. 7 and 8 if it is an LCR. Alternatively, but not shown, the 2-pole filter 82 can have a single-ended or unbalanced port providing a single-ended or unbalanced port of the 6-pole filter cascade, which thereby also provides a balun function.

As already indicated above, similar or conventional cascading techniques can be applied to produce even higher order filters as desired.

Although particular embodiments of the invention have been described in detail, it should be appreciated that numerous modifications, variations, and adaptations may be made without departing from the scope of the invention as defined in the claims.

What is claimed is:

1. A cascaded surface wave device filter comprising:
   a first 2-pole surface wave device filter, the first filter having an input port and an output port, one of the ports providing an unbalanced signal connection and the other of the ports providing a balanced signal connection to the first filter;
   a second 2-pole surface wave device filter, the second filter having an input port and an output port, one of the ports providing an unbalanced signal connection and the other of the ports providing a balanced signal connection to the second filter; and
   a cascade connection of the first filter with the second filter, the cascade connection connecting together the balanced signal connections of the first and second filters whereby the filter comprises a 4-pole filter having unbalanced input and output ports.

2. A filter as claimed in claim 1 wherein each of the first and second filters comprises a longitudinally coupled double mode surface wave resonator.

3. A filter as claimed in claim 2 and including a third 2-pole surface wave device filter connected in cascade with the first and second filters, the third filter having a port providing an unbalanced signal connection connected to one of the unbalanced ports of the 4-pole filter.

4. A filter as claimed in claim 1 wherein each of the first and second filters comprises a transversely coupled double mode surface wave resonator.

5. A filter as claimed in claim 4 including a third 2-pole surface wave device filter connected in cascade with the first and second filters, the third filter having a port providing an unbalanced signal connection connected to one of the unbalanced ports of the 4-pole filter.

6. A filter as claimed in claim 1 wherein the 2-pole filters are arranged side by side on the same substrate.

7. A filter as claimed in claim 1 wherein the 2-pole filters are arranged side by side in the same package.

8. A filter as claimed in claim 1 and including a third 2-pole surface wave device filter connected in cascade with the first and second filters, the third filter having a port providing an unbalanced signal connection connected to one of the unbalanced ports of the 4-pole filter.

9. A cascaded surface wave device filter comprising:
   a first 2-pole surface wave device filter, the first filter having an input port and an output port, one of the ports providing an unbalanced signal connection and the other of the ports providing a balanced signal connection to the first filter;
   a second 2-pole surface wave device filter, the second filter having an input port and an output port one of the ports providing an unbalanced signal connection and the other of the ports providing a balanced signal connection to the second filter: and
   a cascade connection of the first filter with the second filter, the cascade connection connecting together the unbalanced signal connections of the first and second filters, whereby the filter comprises a 4-pole filter having balanced input and output ports.

10. A filter as claimed in claim 9 wherein each of the first and second filters comprises a longitudinally coupled double mode surface wave resonator.

11. A filter as claimed in claim 10 and including a third 2-pole surface wave device filter connected in cascade with the first and second filters, the third filter having a port providing a balanced signal connection connected to one of the balanced ports of the 4-pole filter.

12. A filter as claimed in claim 9 and including a third 2-pole surface wave device filter connected in cascade with the first and second filters, the third filter having a port providing a balanced signal connection connected to one of the balanced ports of the 4-pole filter.

13. A filter as claimed in claim 9 wherein each of the first and second filters comprises a transversely coupled double mode surface wave resonator.

14. A filter as claimed in claim 13 and including a third 2-pole surface wave device filter connected in cascade with the first and second filters, the third filter having a port providing a balanced signal connection connected to one of the balanced ports of the 4-pole filter.

15. A filter as claimed in claim 9 wherein the 2-pole filters are arranged side by side on the same substrate.

16. A cascaded surface wave device filter comprising:
   a first 2-pole longitudinally coupled double mode surface wave resonator filter, the first filter having an input port providing a balanced signal connection and an output port providing an unbalanced signal connection to the first filter; and
   a second 2-pole longitudinally coupled double mode surface wave resonator filter, the second filter having an input port providing an unbalanced signal connection and an output port providing a balanced signal connection to the second filter;
   wherein the first filter and the second filter are connected together in cascade by an unbalanced signal connection between the input port of the second filter and the output port of the first filter, whereby the cascaded surface wave device filter comprises a 4-pole filter having balanced input and output ports.

17. A filter as claimed in claim 16 and including a third 2-pole longitudinally coupled double mode surface wave resonator filter connected in cascade with the first and second filters, the third filter having a port providing a balanced signal connection connected to one of the balanced ports of the 4-pole filter.

* * * * *